(12) United States Patent
Briffett

(10) Patent No.: US 8,588,718 B2
(45) Date of Patent: Nov. 19, 2013

(54) FREQUENCY MODULATED BROADCASTS

(75) Inventor: Neil Briffett, Surrey (GB)

(73) Assignee: Nokia Corporation, Espoo (FI)

( * ) Notice: Subject to any disclaimer, the term of this patent is extended or adjusted under 35 U.S.C. 154(b) by 22 days.

(21) Appl. No.: 13/160,657

(22) Filed: Jun. 15, 2011

(65) Prior Publication Data

US 2011/0312291 A1 Dec. 22, 2011

(30) Foreign Application Priority Data

Jun. 17, 2010 (GB) .................................. 1010167.3

(51) Int. Cl.
H04B 1/10 (2006.01)
H04H 40/81 (2008.01)
H03G 3/34 (2006.01)
H03G 3/26 (2006.01)

(52) U.S. Cl.
CPC . *H03G 3/344* (2013.01); *H03G 3/26* (2013.01)
USPC ........... 455/221; 455/219; 455/229; 455/230; 381/11

(58) Field of Classification Search
USPC ........... 455/218–224, 229, 230, 232.1, 234.1, 455/245.1, 250.1, 296, 306, 309, 312; 381/11, 12, 13
See application file for complete search history.

(56) References Cited

U.S. PATENT DOCUMENTS

| 4,225,751 | A | * | 9/1980 | Hershberger ................... 381/16 |
| 4,323,731 | A | * | 4/1982 | Hershberger ................... 381/16 |
| 4,329,714 | A | * | 5/1982 | Pritchard ...................... 348/738 |
| 4,332,978 | A | * | 6/1982 | Streeter .......................... 381/16 |
| 4,405,835 | A | * | 9/1983 | Jansen et al. .................... 381/15 |
| 4,419,541 | A | * | 12/1983 | Kishi et al. ...................... 381/7 |
| 4,994,754 | A | * | 2/1991 | Ohta ............................. 329/318 |
| 5,036,543 | A | * | 7/1991 | Ueno ............................. 381/13 |
| 5,187,576 | A | * | 2/1993 | Na ................................ 348/485 |
| 5,255,319 | A | * | 10/1993 | Nakamura et al. ............. 381/13 |
| 5,630,217 | A | * | 5/1997 | Matsumoto ................... 455/222 |
| 5,666,658 | A | * | 9/1997 | Borchardt et al. ............. 455/42 |
| 6,215,981 | B1 | * | 4/2001 | Borchardt et al. ............. 455/42 |
| 7,706,542 | B2 | * | 4/2010 | Suganuma ..................... 381/13 |
| 2009/0202024 | A1 | * | 8/2009 | Inoue et al. .................... 375/347 |
| 2009/0286498 | A1 | * | 11/2009 | Katayanagi ................ 455/277.2 |
| 2010/0232482 | A1 | * | 9/2010 | Murali .......................... 375/219 |
| 2011/0201290 | A1 | * | 8/2011 | Miyagi et al. .............. 455/226.1 |

FOREIGN PATENT DOCUMENTS

| EP | 0881779 | | 12/1998 | |
| JP | 2000115002 | | 4/2000 | |
| JP | 2002-009650 | * | 1/2002 | ............... H04B 1/10 |
| JP | 2002009650 | | 1/2002 | |
| JP | 2004-242221 | * | 8/2004 | ............... H04B 1/10 |

OTHER PUBLICATIONS

Extended European Search Report dated Apr. 14, 2013 for Application No. 11167621.9-1907/2398170.

* cited by examiner

*Primary Examiner* — Duc M Nguyen
(74) *Attorney, Agent, or Firm* — Locke Lord LLP

(57) ABSTRACT

A method comprises detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and in response to the detection, automatically adjusting operation of the frequency modulated broadcast receiver. Automatically adjusting operation comprises adjusting one or more parameters or settings in such a way as to alter the susceptibility of a speaker arrangement to the possibility of being overdriven by overdeviated frequency modulated broadcasts.

21 Claims, 5 Drawing Sheets

FREQUENCY MODULATED BROADCASTS

FIELD OF THE INVENTION

This invention relates to frequency modulation broadcast, and in particular to methods and apparatus relating to frequency modulated broadcast receivers.

BACKGROUND OF THE INVENTION

It is increasingly common for mobile phones, smart phones and other portable devices to be provided with frequency modulation (FM) radio receivers. Such FM receivers are able to reproduce mono or stereo audio content from signals that are frequency modulated onto a carrier. Typically, the audio content is music, news and commentary etc. In most of the world, FM radio broadcasts are provided in the very high frequency (VHF) part of the radio spectrum, typically between 87.5 and 108.0 MHz. FM broadcasting began in 1939. For many years, FM broadcasts were received using analogue radio receivers. However, the current trend is for FM radio receivers to be digitally implemented, with a downmixed baseband signal being sampled by an analogue to digital converter (ADC) and processed in the digital domain.

SUMMARY OF THE INVENTION

A first aspect of the invention provides a method comprising:

detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and in response to the detection, automatically adjusting operation of the frequency modulated broadcast receiver, wherein automatically adjusting operation comprises adjusting one or more parameters or settings in such a way as to alter the susceptibility of a speaker arrangement to the possibility of being overdriven by overdeviated frequency modulated broadcasts.

A second aspect of the invention provides computer readable instructions that when executed by computer apparatus control it to perform the method.

A third aspect of the invention provides apparatus comprising:

means for detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and means, in response to the detection, for automatically adjusting operation of the frequency modulated broadcast receiver, wherein the means for automatically adjusting operation comprises means for adjusting one or more parameters or settings in such a way as to alter the susceptibility of a speaker arrangement to the possibility of being overdriven by overdeviated frequency modulated broadcasts.

A fourth aspect of the invention provides apparatus comprising at least one processor, at least one memory, and at least one computer program stored in the at least one memory, wherein the apparatus is configured to:

detect whether or not at least one of the following conditions is present:

a frequency modulation broadcast receiver is tuned to an overdeviated frequency modulated broadcast, or the frequency modulation broadcast receiver is at a location where overdeviated frequency modulated broadcasts exist, or the apparatus has received a user input indicating the presence of an overdeviated frequency modulated broadcast; and to respond to the detection by automatically adjusting operation of the frequency modulated broadcast receiver, wherein automatically adjusting operation comprises adjusting one or more parameters or settings in such a way as to alter the susceptibility of a speaker arrangement to the possibility of being overdriven by overdeviated frequency modulated broadcasts.

A fifth aspect of the invention provides apparatus comprising hardware or hardware and software, the apparatus being configured to:

detect whether or not at least one of the following conditions is present:

a frequency modulation broadcast receiver is tuned to an overdeviated frequency modulated broadcast, or the frequency modulation broadcast receiver is at a location where overdeviated frequency modulated broadcasts exist, or the apparatus has received a user input indicating the presence of an overdeviated frequency modulated broadcast; and to respond to the detection by automatically adjusting operation of the frequency modulated broadcast receiver, wherein automatically adjusting operation comprises adjusting one or more parameters or settings in such a way as to alter the susceptibility of a speaker arrangement to the possibility of being overdriven by overdeviated frequency modulated broadcasts.

A sixth aspect of the invention provides a computer readable medium having stored thereon computer code for execution by computer apparatus control, the computer readable medium comprising:

computer code for detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and computer code for responding response to the detection by automatically adjusting operation of the frequency modulated broadcast receiver, wherein automatically adjusting operation comprises adjusting one or more parameters or settings in such a way as to alter the susceptibility of a speaker arrangement to the possibility of being overdriven by overdeviated frequency modulated broadcasts.

BRIEF DESCRIPTION OF THE DRAWINGS

Embodiments of the invention will now be described, by way of example only, with reference to the accompanying drawings in which.

DETAILED DESCRIPTION OF THE EMBODIMENTS

Whereas in most countries there are strict regulations that ensure that FM broadcasts are limited to a deviation of ±75 kHz to ±80 kHz from the carrier signal, giving rise to a total bandwidth of 150 or 160 kHz, it is technically possible for FM broadcasters to increase the bandwidth of broadcasts, which is known as overdeviation. For the broadcaster, this has the positive effect of appearing louder, provides a higher signal to noise ratio (SNR) and may also swamp or interfere with competing broadcasts. In the US and Europe in particular, broadcasters that transmit overdeviated signals are punished, typically through financial penalties, but the same is not true in many other countries. Also, some countries do not have restrictions on the bandwidth of FM broadcasts at all. As such, an FM broadcast receiver optimised for use in Europe or the US may not function optimally in some other countries.

Although an overdeviated FM broadcast signal can produce a louder output on an analogue FM broadcast receiver, the same is not necessarily true where a digital receiver is used. Instead, digital circuit used to process the signal may saturate, giving rise to squared-off waveforms in the digital domain. The provision of squared-off signals to speakers, particularly integrated hands free (IHF) speakers but also headphones, headsets or separate (external) speakers, can result in them being overdriven.

It is an aim of the invention to provide an FM receiver that is tolerant of overdeviated FM broadcasts.

Figure 1:
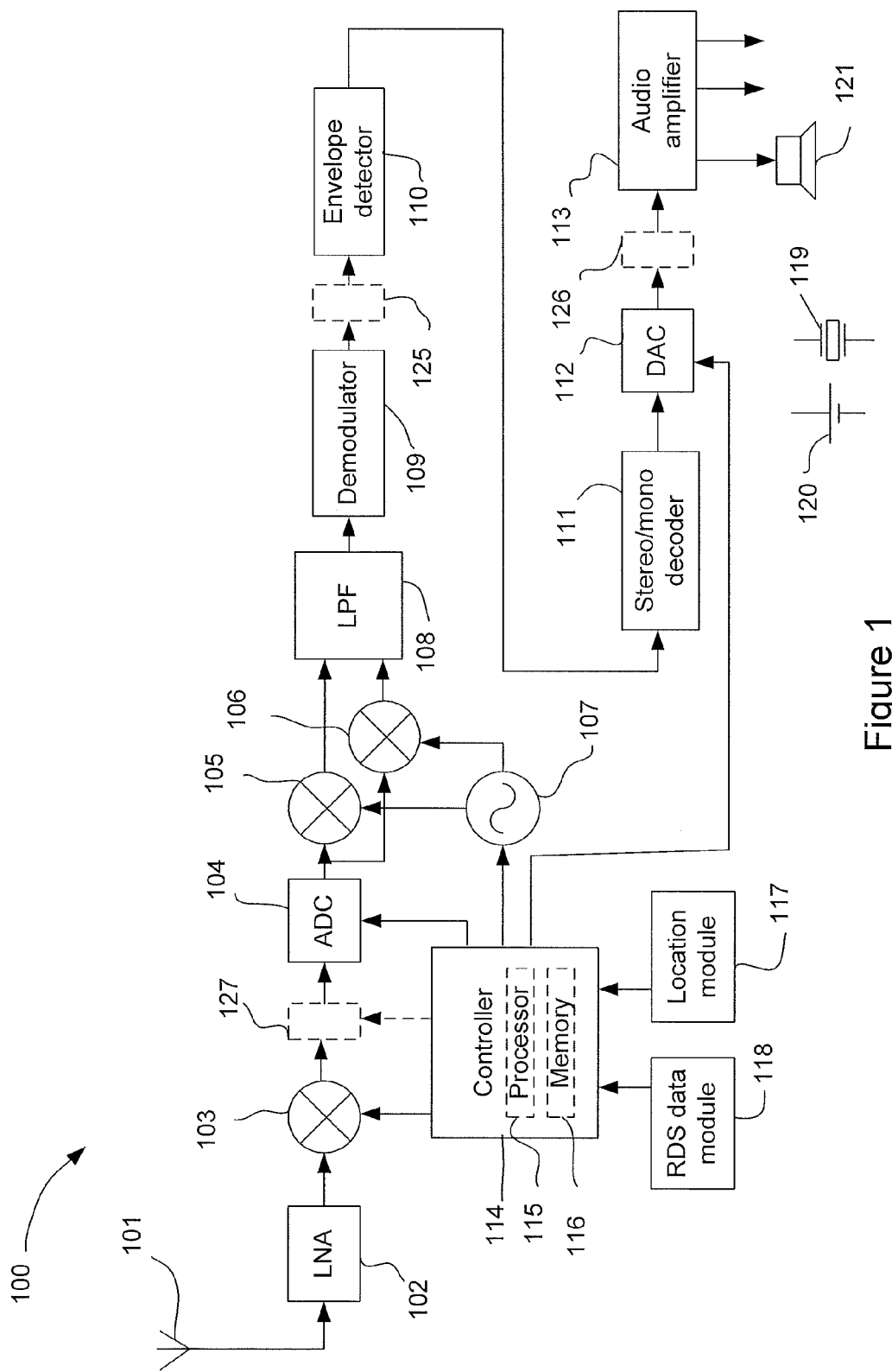
FIG. 1 is a schematic diagram illustrating a digital FM receiver embodying aspects of the invention.

Referring firstly to FIG. 1, a receiver 100 according to aspects of the invention includes an antenna 101. The antenna 101 may for instance be implemented as part of a cable connecting a device 10 (shown in FIGS. 2 and 3) in which the receiver 100 is implemented to some headphones (not shown). A low noise amplifier (LNA) 102 is coupled to the antenna 101. An output of the LNA is provided to an analogue mixer 103. An analogue to digital converter (ADC) 104 is coupled to an output of the analogue mixer 103. An output of the ADC 104 is provided to inputs of first and second digital mixers 105, 106 respectively. A digital local oscillator (LO) 107 is coupled to other inputs of the first and second digital mixers 105, 106. Oscillator signals provided by the digital LO 107 are 90° out of phase, resulting in a quadrature mixer arrangement. Outputs of the first and second digital mixers 105, 106 are provided to inputs of a low pass filter (LPF) 108. A demodulator 109 is coupled to an output of the LPF 108. An output of the demodulator is coupled to an input of an envelope detector 110. A stereo/mono decoder 111 is coupled to an output of the envelope detector 110. A digital to analogue converter (DAC) 112 is coupled to an output of the stereo/mono decoder 111. A stereo audio amplifier 113 is coupled to an output of the DAC 112. Left and right headphone audio channels are provided at the output of the audio amplifier 113. Also provided are left and right audio outputs to an integrated handsfree speaker (IHF) speaker arrangement. In some embodiments, the IHF speaker arrangement is a mono device, and the audio amplifier 113 provides mono audio on a single channel to the IHF speaker arrangement. In other embodiments, IHF speaker arrangement is a stereo device, and the audio amplifier 113 provides stereo audio on two separate channels to the IHF speaker arrangement.

A controller 114 is connected to control numerous ones of the components of the receiver 100. The controller 114 may be implemented as a microcontroller or processor 115 that executes a computer program stored in a memory 116. Alternatively, the controller 114 could be implemented as an application specific integrated circuit (ASIC). Alternatively, the controller 114 could be implemented as a field programmable gate array (FPGA). Alternatively, the controller 114 could take any other suitable form.

The controller 114 receives inputs from a number of components of the receiver 100. These include a location module 117 and a radio data module 118, such as a radio data service (RDS) data module. The controller 114 may also be configured to receive inputs from other components of the receiver 100, as will be described below.

A battery 120 is operable to provide electrical power to the active ones of the components of the receiver 100.

The LNA 102 serves to amplify radio signals received picked up by the antenna 101. The analogue mixer 103 serves to downconvert the amplified RF signals provided by the LNA to an intermediate frequency (IF). The ADC 104 is configured to sample the output of the analogue 103 at a sampling rate that is set by the controller 114. The controller 114 may provide data indicating a sampling rate directly to the ADC 104, from which the ADC may derive a clock signal from a master oscillator 119, or the controller 114 may provide a clock signal directly to the ADC 104.

The sampling rate of the ADC 104 is at least twice the frequency of the signals of interest that are provided at the output of the analogue 103, in order to satisfy the Nyquist sampling criterion. Alternatively, if the sampling rate of the ADC 104 is suitably high, the analogue mixer 103 can be omitted and the ADC 104 can instead directly sample the output of the LNA 102.

The controller 114 is configured to control the analogue mixer 103 to mix the received RF signal with an oscillator signal of a suitable frequency. The controller 114 may instruct the analogue mixer 103 to obtain the signal that is mixed with the RF signal directly from the master oscillator 119, or alternatively the controller 114 could provide the oscillator signal directly to the analogue mixer 103.

The digital local oscillator (LO) 107 is controlled to provide an oscillator signal to the first and second mixers 105, 106 by the controller 114. The digital LO 107 is clocked at a frequency that is derived from the master oscillator 119. The clock frequency of the digital local oscillator may be controlled by the controller 114. Alternatively, the frequency may be fixed, in which case the frequency could not be varied by the controller 114.

The first and second digital mixers 105, 106 provide in phase and quadrature versions of the digitised output of the analogue mixer 103 (or the LNA 102 if the analogue mixer 103 is absent) and the signal provided by the digital LO 107. The LPF 108 obtains different signals from the outputs of the first and second mixers 105, 106, and provides filtered different signals to the demodulator 109. The demodulator 109 provides an output signal that is amplitude modulated with the signal that is frequency modulated onto the RF carrier received at the antenna 101. The envelope detector 110 detects the envelope of the signal provided by the demodulator 109, and thus removes the carrier. The demodulated output of the envelope detector 110, which is in the digital domain, is provided to the stereo/mono decoder 111. The stereo/mono decoder 111 is operable under the controller 114 selectively to provide one or two channels of audio to the DAC 112. The DAC 112 is operable, under control of the controller 114, to provide one or two channel analogue audio signals, based on the one or two channel digital signals received from the stereo/mono decoder 111, to the audio amplifier 113. The audio amplifier 113 is configured to amplify received analogue signals and provide left and right channel output signals, having a suitable output impedance, at its outputs. If a mono signal is received at the audio amplifier 113 from the DAC 112, the signals provided on the left and right channel outputs of the audio amplifier are substantially the same. The same applies to the signals provided to the left and right IHF channels.

The location module 117, if present, is operable to provide the controller 114 with information relating to the current location of the device 10 in which the receiver 100 is included. The location module 117 may be operable to provide the location in the form of location coordinates, for instance GPS coordinates, or as an identification of a node in a communication system, for instance indicating a cell of a mobile cellular communication system, or simply indicating a country or state, for instance. Depending on the nature of the location provided, the location module 117 may include a positioning receiver, such as a GPS, A-GPS, Galileo, Glonass, Naystar etc. receiver, or merely software for determining a location from signals received from a mobile telephone base station, WiFi hotspot or such like. The location module 117 may instead receive information identifying the location of the device 10 from an external device or network. The location may be determined for instance by a mobile telephone network by triangulating distance from multiple base stations or other transceivers. The country in which the device 10 is located may be determined by the location module 117 by detecting a country code from a cellular telephone network, e.g. by detecting the country code 44 from a network operating in the United Kingdom.

The radio data module 118 is configured to provide radio data received in respect of a radio station to which the receiver 100 is tuned to the controller 114. In this respect, the radio data module 118 may have an input connected to the output of the demodulator 109, from where the RDS data can be decoded. The radio data module 118 may be a radio data service (RDS) module, a radio broadcast data system (RBDS) module, or other radio data channel module. The radio data module 118 may be implemented as software, as hardware or as a combination of software and hardware.

Figure 2:
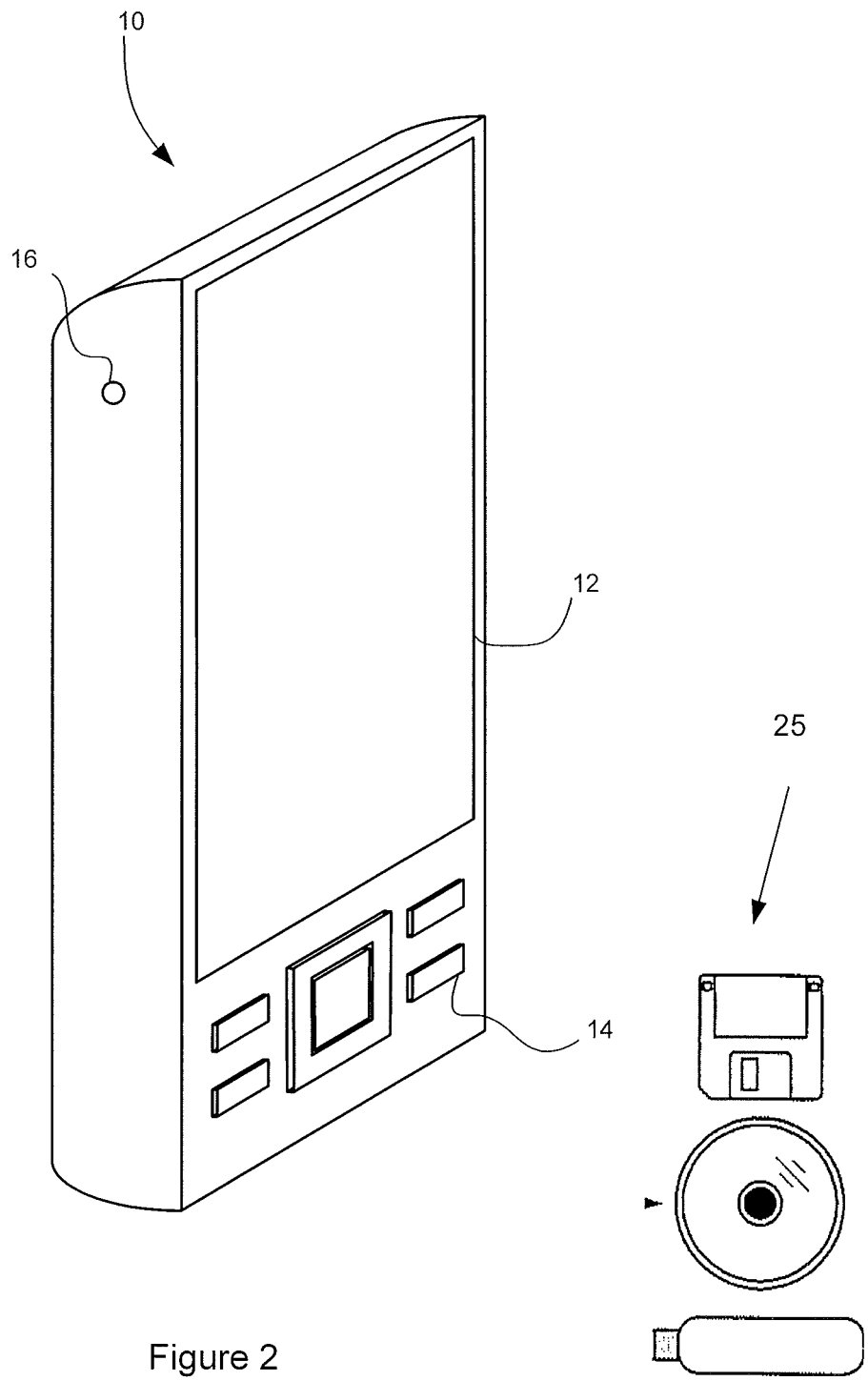
FIG. 2 is an electronic device according to exemplary embodiments of the invention.

FIG. 2 depicts an example of an electronic device 10 according to exemplary embodiments of the invention. In this example, the electronic device 10 is a portable mobile terminal 10 in the form of a mobile telephone. The portable electronic device 10 includes a touch-sensitive display 12, and a keypad 14. The keypad 14 comprises one or more physical keys for receiving inputs from a user. The touch-sensitive display 12 is operable to detect the incidence of touch inputs on the touch-sensitive display 12 and also to display information and content to a user of the device 10.

The device 10 may instead take another form, for instance a home or car audio system, e.g. a hi-fi device.

Figure 3:
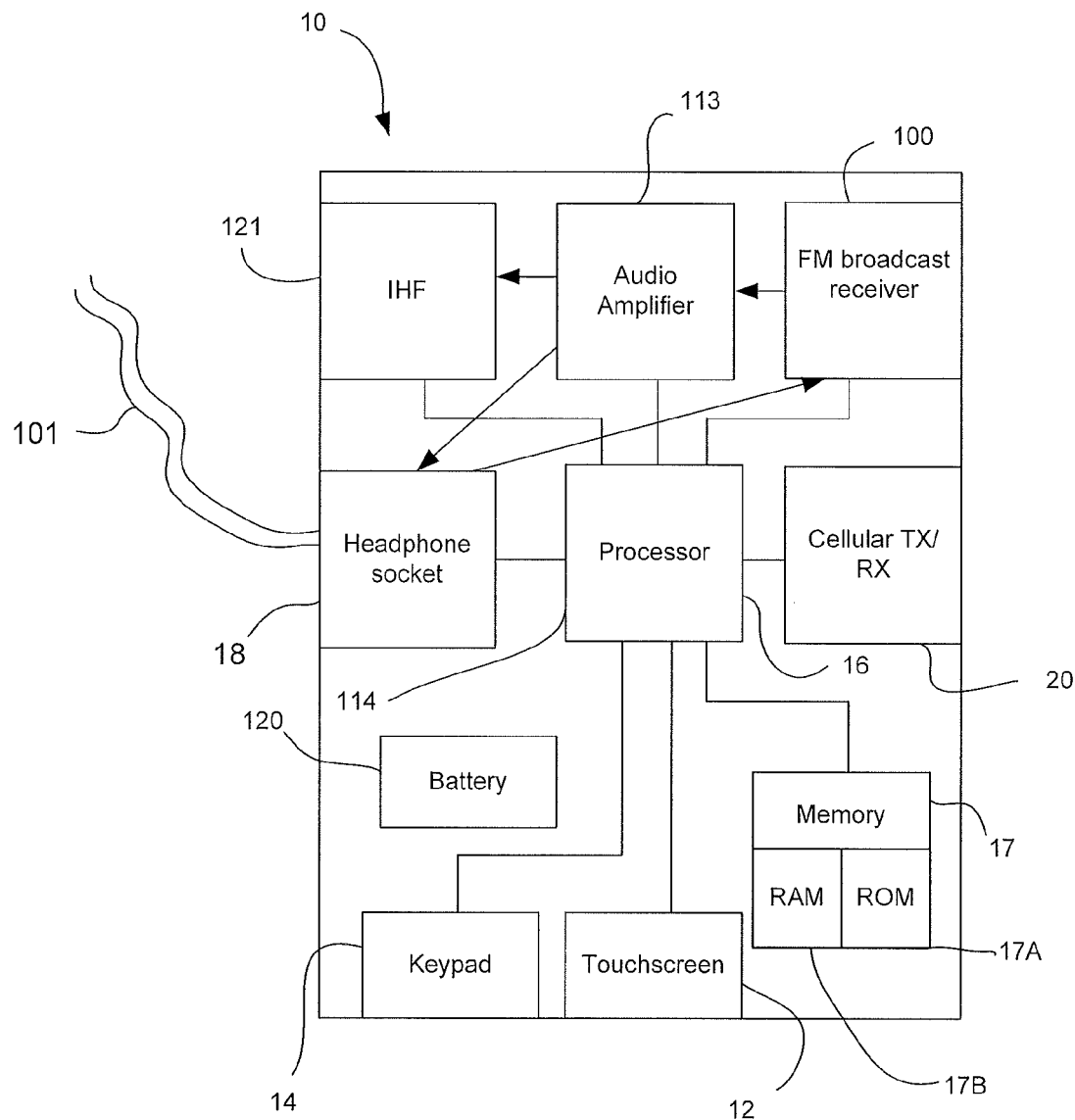
FIG. 3 is a schematic representation of some components of the electronic device of FIG. 2 and their connections.

FIG. 3 is a schematic depiction showing also internal components of the device 10 of FIGS. 1 and 2.

The portable electronic device 10 shown in FIG. 3 comprises the FM broadcast receiver 100, although the audio amplifier 113, the IHF speaker 121 and the antenna 101 are shown separately. The device 10 includes a processor 15 and memory 16, which together may provide the controller 114 of FIG. 1, or alternatively the controller 114 may be a separate device. The device 10 also includes a cellular transceiver 20, the battery and a headphone socket 18.

A headphone cable connected into the headphone socket 18 serves as the antenna 101. The headphone socket 18 serves as an input to the receiver 100 as well as an output to the audio amplifier 113. Alternatively, the device 10 may include an internal FM radio antenna, in which case the headphone socket may not serve as an input to the receiver 100. Further alternatively, the device 10 may include an internal FM radio antenna and utilise this in conjunction with the headphone socket serving as an input to the receiver 100, in order to improve performance. The IHF 121 also is connected to left and right outputs of the audio amplifier 113.

It will be appreciated that the device 10 and the receiver 100 include numerous components that are omitted from the FIGURES for the sake of clarity.

The processor 16 controls most of the other components of the device 10. The processor 16 is operable to provide signals for controlling the output of the touch-sensitive display 12. The controller 114 is operable also to receive signals from the touch-sensitive display 12, the signals indicating the incidence of a touch input on the touch-sensitive display 12. The controller 114 is operable to control other components of the device 10 based in part on the signals received from the touch-sensitive display 12.

The processor 16 operates under the control of computer-readable instructions, particularly an operating system and additional software, middleware or firmware modules, and software applications. The operating system and software etc. are stored on a tangible, non-transitory memory medium such as ROM 17A, that forms part of the memory 17. The memory 17 may generally include removable or imbedded memories that operate in a static or dynamic mode. Further, memory 17 may include ROM, random access memory (RAM), and rewritable memories such as Flash, EPROM, etc. In the following, it will be appreciated that the processor performs the stated functions and actions under the control of the computer-readable instructions using a tangible, transitory memory medium, such as RAM 17B, that also forms part of the memory 17. One application that is stored in the memory 17 is an FM broadcast receiver application, that is operable to control operations of the device 10 relating to FM broadcast reception, demodulation and presentation and to allow user control and provide information to a user.

General operation of the receiver 100 of FIG. 1 will now be described.

Frequency modulated audio signals are picked up by the antenna 101 and are amplified by the LNA 102. If present, the analogue mixer 103 down converts the received signals to an intermediate frequency (IF). The down mixing frequency is set by the controller 114, and is derived from the oscillator 119. The downmixing frequency may be fixed, or it may be adjusted by the controller depending on various factors.

A sampling frequency of the ADC 104 is set by the controller 114, with reference to the oscillator 119. The sampling frequency of the ADC may be of the order of tens of MHz, which allows Nyquist sampling the intermediate frequency provided by the analogue mixer 103 but does not encompass the sum of the frequencies of the RF carrier and the down mixing frequency. Alternatively, if the analogue mixer 103 is omitted, the sampling frequency of the ADC 104 is set by the controller 104 to be equal to or twice the maximum carrier frequency of interest. This allows the receiver 100 to demodulate the desired information directly from the RF carrier.

The FM broadcast band to which the receiver 100 is optimised is in the range of 87.5 to 108.0 MHz.

The digital LO 107 is controlled to provide in phase and quadrature sinusoidal signals to the first and second digital mixers 105, 106 respectively, as set by the controller 114 with reference to the oscillator 119. The controller 114 sets the frequency of the digital local oscillator signals depending on the carrier of the FM broadcast signal to which the receiver 100 is required to be tuned. The frequency of the digital LO 107 is set so that the signals at the outputs of the digital mixers 105, 106 are at baseband. As such, the frequencies of the digital LO 107 and the analogue mixer 103 are chosen such that the sum of the frequencies is equal to the carrier frequency of the signal of interest. If the analogue mixer 103 is omitted, the frequency of the digital local oscillator 107 is set to be the carrier frequency of the signal of interest. In this way, the digital mixers 105, 106 perform direct downconversion of the received FM signal in the digital domain.

The LPF 108 filters out high frequency components of the signals provided by the digital mixers 105, 106, thereby providing difference signals (and excluding the sum signals) to the demodulator 109. The demodulator 109 demodulates the baseband signals, through differentiation or in any other suitable way, and provides the results to the envelope detector 110. The envelope detector 110 extracts provides a digital baseband representation of the confirmation that was modulated on to the RF carrier to which the receiver 100 is tuned. This information is provided in a form from which stereo or mono audio can be derived, e.g. in left+right and left−right channels. The stereo/mono decoder 111 is controlled by the controller 114 to provide a stereo or mono signal to the DAC 112. Depending on its control, the stereo/mono decoder 111 process is the signals received from the envelope detector 110 to provide the required stereo or mono output to the DAC 112.

The DAC 112 is controlled by the controller 114 to convert the received digital signals to an analogue signal, or more correctly to two separate analogue channels, and provide the result to the audio amplifier 113. In the event that the stereo/mono decoder 111 provides mono signals to the DAC, the signals on the left and right audio channels provided to the audio amplifier 113 are identical. The audio amplifier 113 amplifies the received audio signals and provides amplified outputs on left and right channels. The channels are either headphone channels or IHF channels depending on control by the controller 114. The controller 114 may select headphone or IHF output of the audio amplifier 113 depending on, for instance, a user input.

The first and second digital mixers 105, 106, the digital local oscillator 107, the LPF 108, the demodulator 109, the envelope detector 110 and the stereo/mono decoder 111 may be implemented as a single digital signal processor (DSP). The DSP may be implemented as an ASIC, an FPGA, as software executed by a processor, e.g. the processor 16, in conjunction with memory, e.g. the memory 17, or in any other suitable way.

Briefly, the device 10 operates firstly to detect that a received FM broadcast is overdeviated, and then to adjust automatically operation of the receiver 100 such as to reduce the likelihood of speakers attached to the audio amplifier 113 being overdriven. Detecting the presence of an overdeviated FM broadcast may comprise detecting from signals present at some part of the chain of the receiver 100 that a signal to which the receiver is tuned is overdeviated. Alternatively, it may comprise inferring the presence of an overdeviated FM broadcast from the location of the device. Alternatively, it may involve receiving an input from a user indicating the presence of an overdeviated FM broadcast.

A number of alternatives for the detection that the receiver 100 is tuned to an overdeviated FM broadcast will now be described. It will be appreciated that some or all of these may be implemented in a given receiver, although typically only one will be implemented in a receiver.

In a first alternative, the audio amplifier 113 is configured such as to be able to detect a distortion level of signals received from the DAC 112. This may be achieved in any suitable way. For instance, the audio amplifier 112 may include a high pass filter that is configured to block frequencies below a threshold frequency, that may be in the range of 12 kHz to 20 kHz, so as to pass only signals that are not audio frequency. A detector coupled to the output of the high pass filter then is able to determine a level of signals resulting from saturation of the signals provided by the DAC 112. The controller 114 is configured to be responsive to an amount of distortion above a threshold to infer the presence of an overdeviated signal at the tuned frequency.

In a second alternative, the DAC 112 is configured to provide an output indicative of the signal provided by the stereo/mono decoder 111 reaching the limit of the range of the DAC 112. An output may be provided to the controller 114 for every clock cycle on which the maximum limit is reached, or alternatively, the DAC 112 may be configured to provide a signal to the controller 114 only once the proportion of clock signals on which the dynamic ranges reached exceeds a threshold. The threshold may, for instance, be in the range of 2 to 5% of the total number of clock cycles within a rolling window. Alternatively, detection of the signal provided by the stereo/mono decoder 111 reaching the limit of the range of the DAC 112 may be detected by detecting that the value of consecutive samples indicates the overflow of the DAC limit resulting in a change in the bit that relates to the sign (i.e. + or −).

In a third alternative, the controller 114 is configured to detect the deviation depth of the signals provided by the LNA 102, for instance by detecting the signals at the input of the analogue mixer 103. By detecting the deviation depth, or bandwidth, the controller 114 is able to determine whether the deviation depth exceeds the permitted deviation, which in most cases will be 150 Hz or 160 Hz. Alternatively, the controller 114 may be configured to monitor the deviation depth from the IF signals provided at the output of the analogue mixer 103.

In a fourth alternative, the user enters an input indicating that the received signal is overdeviated. The mobile terminal may receive this input either from an option in a menu system, from a dedicated key or virtual key provided on the user interface when an FM broadcast receiver application is running, or as a voice control, for instance. In the presence of a significantly overdeviated FM broadcast signal, prior to compensation the audio output of the device would sound distorted. On noticing a distorted audio output, the user is able to control the mobile terminal to take remedial action. On the user interface provided by the FM broadcast receiver application, a soft key or virtual key, for instance denoted "reduced distortion" may be selectable by the user. Alternatively, the user may be required to navigate to a suitable option in the menu system either from the FM broadcast receiver application or from some other part of the user interface provided by the mobile terminal. The mobile terminal may be responsive to a speech input, for instance the phrase "reduce distortion" or some other phrase or term that may have been predefined by the mobile terminal 10 or by the user.

In a fifth alternative, the controller 114 is configured to compare a radio station name received from the radio data module 118 to a database of radio stations that are known to broadcast overdeviated signals. If the controller 114 detects a match in the database, it can infer that the radio station to which the receiver 100 is tuned is broadcasting an overdeviated signal.

In a sixth alternative, the controller 114 is configured to compare a location of the mobile terminal, as provided by the location module 117, to a database of locations in which overdeviated FM broadcast signals are known to exist. Optionally, the controller 114 is configured to compare the location in conjunction with the frequency of the FM broadcast of interest. The frequency may be determined by the controller 114 in any suitable way.

In a seventh alternative, the digital components of the receiver are implemented as a DSP and the presence of overdeviated FM signals is detected by detecting that a gradient (dv/dt) of signals passing through the DSP exceed a predetermined threshold.

The location provided by the location module 117 may be in the form of coordinates, for instance coordinates provided by a positioning receiver such as a GPS receiver. Alternatively, the location module 117 could provide location information in terms of identifying a cell with which the mobile terminal is communicating in a cellular network. Depending on the size of the cell, the cell identifier may identify a relatively small area, of a radius of perhaps tens of metres, or a relatively larger area, with a radius of tens of kilometres. Alternatively, the location module 117 could provide location information in the form of a country identifier.

In embodiments in which the controller 114 uses location information and frequency information, the database to which the controller 114 refers when making a determination as to whether or not an overdeviated FM signal is being received may be relatively complicated. For instance, the database may indicate a location of a broadcast transmitter, as well as the frequency on which the transmitter operations, and indicate a range of the transmitter. The controller 114 can then use this information to determine whether the mobile terminal 10 is within range of the transmitter and thus is possibly receiving the overdeviated FM broadcast. If the controller 114 determines that the mobile terminal 10 may or may not be tuned to an overdeviated FM broadcast, for instance because the location of the mobile terminal 10 is not known with sufficient accuracy or because the database indicates that two or more radio stations are broadcast at the relevant frequency at the location of the mobile terminal, the mobile terminal may assume that overdeviation is present on the received FM broadcast. In this way, the likelihood of over-driving speakers may be reduced. If, however, the receiver 100 is not tuned to an overdeviated FM broadcast, the consequence would be a lower amplitude output from the speaker arrangement.

However the presence of an overdeviated signal is determined, the controller 114 may determine the presence of an overdeviated FM broadcast signal only once, for instance at approximately the time of the FM broadcast receiver application of the mobile terminal being started. This determination then remains in place for the time that the FM broadcast receiver application remains running. Here, the determination is made again once the FM broadcast receiver application is again started, after having been closed. Alternatively, the determination may be made periodically, for instance once every 10 minutes or once every hour, or continuously. In a further alternative, the controller 114 may make the determination in response to a trigger, for instance in response to the detection of a change in location of the mobile terminal, the removal of headphones from the headphone socket 18 or the re-tuning of the FM receiver 100 to a different frequency or radio station. The trigger may alternatively be the ending of FM broadcast reception, which may be achieved at application or user interface level. In a still further alternative, the controller 114 may commence the determination at random or pseudorandom intervals. The frequency at which the determination is performed may depend on factors such as the location of the device, e.g. the country in which the device 10 is located. For instance, the determination may be determined more frequently in India than in the United Kingdom. Here, the determination may be performed in India every time that the receiver 100 is re-tuned to a different radio station and/or the FM receiver application is started, whereas in the United Kingdom the determination may be performed only once per day.

The database may include records identifying radio stations that are known not to broadcast overdeviated FM signals. In this way, the controller 114 can detect that a radio station to which the receiver 100 is tuned is not an overdeviating station, and thus determine that remedial action is not required, without the need to search the entire database.

Once the controller 114 has detected the presence of an overdeviated FM broadcast signal, it takes remedial action. This can take one of a number of forms, as will now be described.

In a first alternative, the controller 114 adjusts the gain of an optional multiplier 125 that is interposed in the receiver chain between the demodulator 109 and the envelope detector 110. Alternatively, the gain multiplier 125 may be thought of as an attenuator. In either case, the controller 114 controls the component 125 to multiply received signals by a number that is less than unity, thereby providing time varying signals of a lower amplitude to the envelope detector 110. The number that is multiplied by the signals provided by the demodulator 109 by the component 125 may be set by the controller to have a value that is dependent on the amount of overdeviation in the received FM broadcast signal. For instance, if the controller 114 detects a slightly overdeviated FM broadcast signal, it may control the component 125 to effect a multiplying factor of 0.8. For instance, the multiplying factor may be in the range of 0.7 to 0.9. If the controller 114 detects a heavily overdeviated FM signal, the component 125 may be controlled by the controller 114 to effect a multiplication factor of 0.6. The multiplication factor may take a value in the range of 0.4 to 0.8. Whether the received FM broadcast signal is slightly or heavily overdeviated may be determined by the controller 114 through the database, if determined on the basis of the location of the mobile terminal, or may be detected from signals at some part of the chain of the receiver 100, or may be entered by the user through the interface of the mobile terminal. The component 125 may operate on the audio part of the received signals only, i.e. it may not operate on the part of the signals that relates to radio data.

In a second alternative, the controller 114 is configured to reduce the gain of the audio amplifier 113 in the presence of overdeviated FM broadcast signals. The amount of reduction of the gain may be dependent on whether the signals are slightly overdeviated or heavily overdeviated, as discussed above. Instead of adjusting the gain of the audio amplifier 113, the controller 114 may adjust the gain of a separate amplifier 126 that is interposed between the DAC 112 and the audio amplifier 113.

In a third alternative, the controller 114 is responsive to detection of an overdeviated FM signal to adjust the stereo/mono decoder 111 to change from stereo mode to mono mode. This is a relatively simple alternative in that no new hardware is required, although it is relatively effective at reducing the likelihood of overdriving of a speaker in the presence of slightly overdeviated FM signals.

In a fourth alternative, the controller 114 is responsive to the detection of an overdeviated FM signal to increase the range of the ADC 104 and the DAC 112 and also to widen the pass band of the LPF 108. In this way, the effectiveness of processing of the received FM broadcast is improved, although at the expense of increased power consumption. As well as accommodating the overdeviated signal in the digital part of the receiver 100, the receiver may include the audio amplifier or other amplifier gain adjustment described above and/or it may include the multiplier/attenuator 125 as described above.

In a fifth alternative, the controller 114 is responsive to the detection of an overdeviated FM broadcast signal to activate or switch-in a filter 127 prior to the ADC 104. The filter 127 is configured to have a bandwidth equal to the permitted FM bandwidth, for instance 150 kHz or 160 kHz, such as to clip the overdeviated part of the received FM signals.

Figure 4:
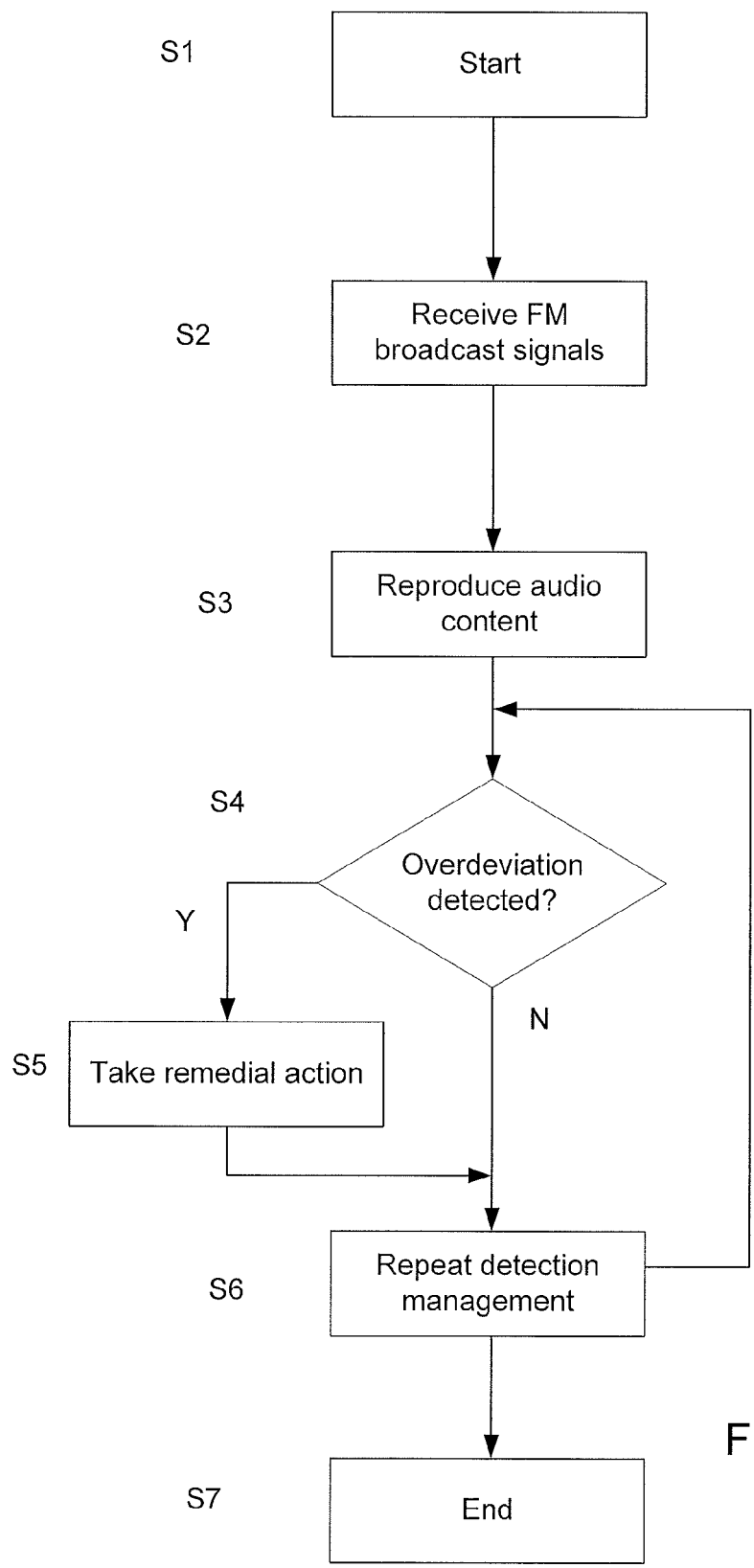
FIG. 4 is a flow chart illustrating operation of the device of FIGS. 2 and 3 embodying some aspects of the invention.

This is shown in the flowchart of FIG. 4. Here, operation starts at step S1. At step S2, the FM broadcast receiver application controls the receiver 100 to receive FM broadcast signals at a frequency of interest (for instance as set by a user of the device 10). At step S3, reproduction of the audio content of the broadcast commences. At step S4, it is determined whether an overdeviated FM broadcast is present, in one of the ways described above (e.g. through overdeviation detection, through inference or through receiving a user input). If overdeviation is present, at step S5 the receiver 100 takes remedial action. Otherwise, no remedial action is taken. Step S6 causes step S4 to be repeated as appropriate and at the appropriate time(s), as described above, until the operation ends at step S7. It will be appreciated that the order of steps S3 and S4 may be reversed.

By adjusting the receiver 100 only in the presence of overdeviated FM broadcasts, the user experience is improved. In particular, compensating for overdeviated inputs in any of the above-described manners results in output audio signals of a reduced amplitude for a given input signal bandwidth. As such, compensating in the absence of overdeviated FM signals provides a quieter output, which may not be loud enough for the user and/or which may not efficiently utilise components of the mobile terminal. By compensating only in the presence of overdeviated FM signals, the loudness of different radio stations may not vary significantly regardless of whether the radio stations are overdeviated or not.

In other embodiments, the device 10 starts in a safe mode, then operates to detect whether a received FM broadcast is overdeviated, and then adjusts automatically operation of the receiver 100 into a normal mode of operation if it is detected that the received FM signal is not overdeviated. In the event that the receiver 100 detects that the received FM signal is overdeviated, the receiver 100 remains in safe mode. Detecting the presence or absence of an overdeviated FM broadcast may comprise detecting from signals present at some part of the chain of the receiver 100 that a signal to which the receiver is tuned is overdeviated. Alternatively, it may comprise inferring the presence or absence of an overdeviated FM broadcast from the location of the device.

A number of alternatives for the detection that the receiver 100 is tuned to an overdeviated FM broadcast are described above, and referred to as first to third, fifth and sixth alternatives. It will be appreciated that some or all of these may be implemented in a given receiver, although typically only one will be implemented in a receiver.

However the presence of an overdeviated signal is determined, the controller 114 may determine the presence or absence of an overdeviated FM broadcast signal only once, for instance at approximately the time of the FM broadcast receiver application of the mobile terminal being started. This determination then remains in place for the time that the FM broadcast receiver application remains running. Here, the determination is made again once the FM broadcast receiver application is again started, after having been closed. Alternatively, the determination may be made periodically, for instance once every 10 minutes or once every hour. In a further alternative, the controller 114 may make the determination in response to a trigger, for instance in response to the detection of a change in location of the mobile terminal or the re-tuning of the FM receiver 100 to a different frequency or radio station. In a still further alternative, the controller 114 may commence the determination at random or pseudorandom intervals.

Once the controller 114 has detected the absence of an overdeviated FM broadcast signal, it takes action to enter the receiver 100 into normal FM receiver mode. This can take one of a number of forms, as will now be described.

In a first alternative, the controller 114 increases the gain of an optional multiplier 125 that is interposed in the receiver chain between the demodulator 109 and the envelope detector 110. Alternatively, the gain multiplier 125 may be thought of as an attenuator. In either case, the controller 114 controls the component 125 to multiply received signals by a number that is greater than unity, thereby providing time varying signals of a higher amplitude to the envelope detector 110. The multiplying factor may be in the range of 1.1 to 1.5.

In a second alternative, the controller 114 is configured to increase the gain of the audio amplifier 113 in the presence of overdeviated FM broadcast signals. Instead of adjusting the gain of the audio amplifier 113, the controller 114 may adjust the gain of a separate amplifier 126 that is interposed between the DAC 112 and the audio amplifier 113.

In a third alternative, the controller 114 is configured to start the operation of the receiver 100 un mono mode and to be responsive to detection of the absence of an overdeviated FM signal to adjust the stereo/mono decoder 111 to change from mono mode to stereo mode. This is a relatively simple alternative in that no new hardware is required, although it is relatively effective at reducing the likelihood of overdriving of a speaker in the presence of slightly overdeviated FM signals.

In a fourth alternative, the controller 114 is responsive to the detection of an overdeviated FM signal to decrease the range of the ADC 104 and the DAC 112 and also to narrow the pass band of the LPF 108. In this way, the effectiveness of processing of the received FM broadcast is maintained, although with reduced power consumption. As well as accommodating the overdeviated signal in the digital part of the receiver 100, the receiver may include the audio amplifier or other amplifier gain adjustment described above and/or it may include the multiplier/attenuator 125 as described above.

In a fifth alternative, the controller 114 is responsive to the detection of the absence of an overdeviated FM broadcast signal to de-activate or switch-out a filter 127 prior to the ADC 104. Prior to being de-activated or switched-out, the filter 127 is configured to have a bandwidth equal to the permitted FM bandwidth, for instance 150 Hz or 160 Hz, such as to clip the overdeviated part of the received FM signals.

By controlling the receiver 100 to accommodate overdeviated FM broadcasts until the absence of overdeviated broadcast is detected, the risk of overdriving the IHF or other speaker(s) is reduced.

Figure 5:
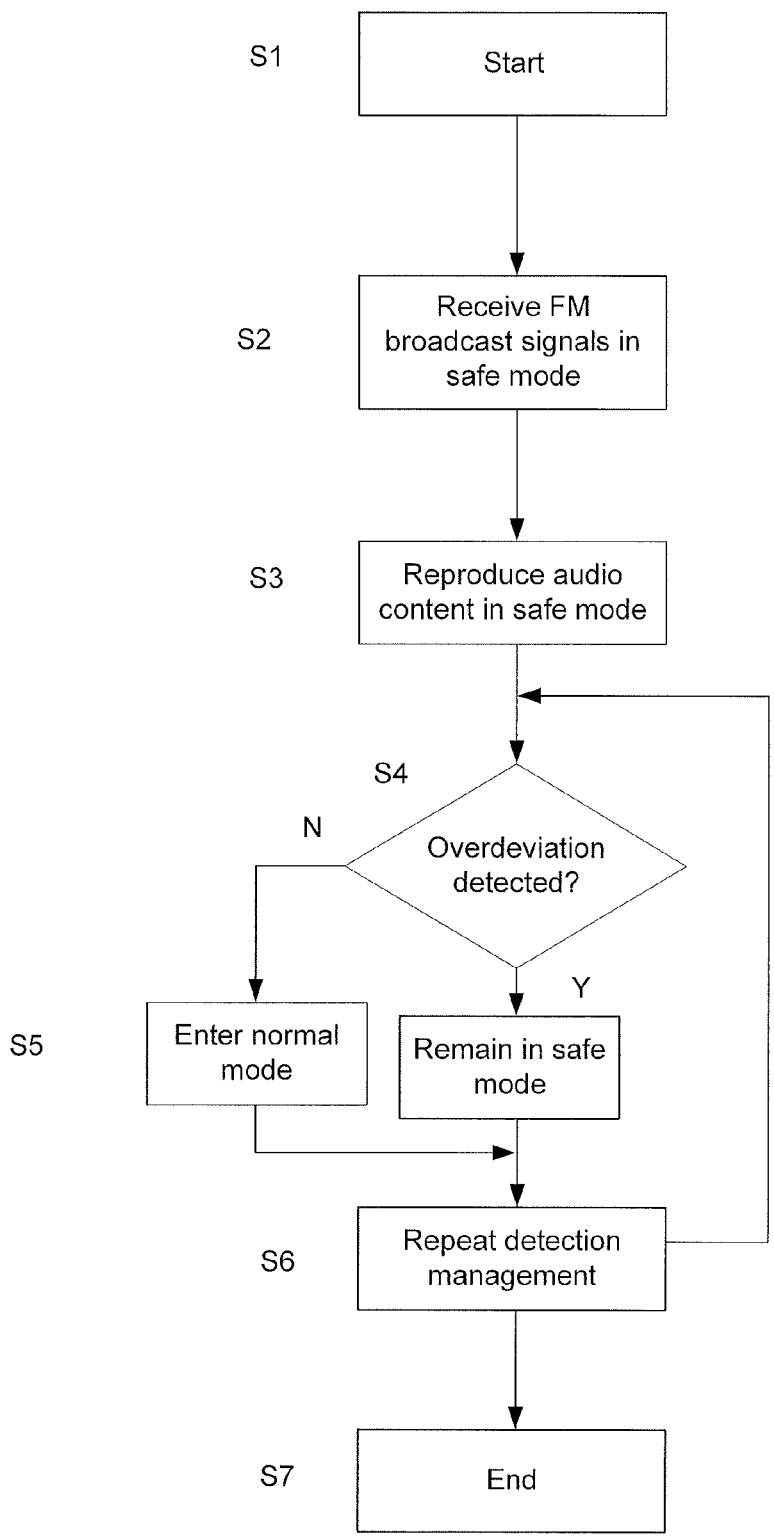
FIG. 5 is a flow chart illustrating operation of the device of FIGS. 2 and 3 embodying some other aspects of the invention.

This is shown in the flowchart of FIG. 5. Here, operation starts at step S1. At step S2, the FM broadcast receiver application controls the receiver 100 to receive FM broadcast signals at a frequency of interest (for instance as set by a user of the device 10). At step S3, reproduction of the audio content of the broadcast commences, although the receiver 100 is set in safe mode. At step S4, it is determined whether an overdeviated FM broadcast is present, in one of the ways described above (e.g. through overdeviation detection, through inference or through receiving a user input). If overdeviation is determined not to be present, at step S5 the receiver 100 enters normal mode and commences normal operation, i.e. without accommodating overdeviated FM broadcast signals. Otherwise, no action is taken, in which case the receiver remains in safe mode. Step S6 causes step S4 to be repeated as appropriate and at the appropriate time(s), as described above, until the operation ends at step S7. It will be appreciated that the order of steps S3 and S4 may be reversed.

It will be appreciated that some overdeviation detection techniques require more from the receiver 100 than other techniques. For instance, detecting the presence or absence of overdeviation through user input is relatively straightforward to achieve, and can be implemented in user interface design. Detecting the presence or absence of overdeviation at the RF front end, conversely, can require additional hardware and thus increase the overall cost of the receiver 100.

Similarly, the different compensation techniques have different cost implications. For instance, switching from stereo to mono or starting in mono then switching to stereo does not require any new hardware but may negatively impact on the user experience. Conversely, implementing dynamically configurable ADC and DAC dynamic range may provide a very good user experience but increase the cost of manufacture of the mobile terminal.

It will be appreciated that the above described embodiments are not limiting on the invention, but are purely illustrative. The scope of the invention is limited only by the appended claims and their equivalents. Alternative embodiments will be immediately apparent to the skilled person.

For instance, the receiver 100 need not be a digital receiver, but may involve only analogue components. In this case, the options for detection of overdeviation are limited to a subset of the options that are available for detection in a digital receiver. However, compensation for overdeviation in a received signal may be simpler, for instance through the user of a controllable attenuator prior to the audio amplifier. It may be noted that the likelihood of overdriving of a speaker in an analogue receiver chain is reduced because there is no potential for saturation of digital components.

Also, although the processor 16 is described as a single device, it may alternatively be provided as a distributed processing system, which may or may not include multi-core processors. The controller 114 may be a microcontroller, DSP or processor that is used exclusively by the FM receiver 100. Alternatively, the controller 114 may include plural processors, DSPs or microcontrollers. The one or more processors of the controller 114 may utilise internal or external memory to execute software.

Additionally, the device 10 may be powered by a different power source, for instance solar power, alternatively or in addition to the battery.

In another embodiment, the device 10 is absent of any transmitters, or any included transmitters have been disabled either permanently, semi-permanently (e.g. through a software update) or temporarily (e.g. by a user entering the device into flight mode). Here, the device 10 may be configured to utilise received radio data and a table of radio stations to determine whether or not overdeviation is present. The table may include a list of overdeviating stations, a list of non-overdeviating stations, or both. The device 10 may determine whether or not overdeviation is present whenever a new station is tuned to and/or when the FM receiver 100 is enabled.

Different aspects of the invention are implemented as software for controlling computer apparatus to perform a method as described above, a device as described above, a module or chip that when included in a device constitutes a device as described above. Such a module or chip likely does include an antenna, but does include an input for receiving signals from an antenna. Software preferably is stored on a medium, such as optical storage (e.g., a CD or DVD) or semiconductor memory (e.g. flash memory), but may also be stored transiently in memory or exist as a signal being communicated over a network. Examples of removable storage media based on magnetic, electronic and/or optical technologies are shown at 25 in FIG. 2, and may serve, for instance, as a data input/output means. Code may include any interpreted or compiled computer language including computer-executable instructions. The code and/or data may be used to create software modules such as operating systems, communication utilities, user interfaces, more specialized program modules, etc.

Other embodiments will be apparent to the skilled person. The scope of the invention is not intended to be limited by the above description. The scope is limited only by the appended claims and their equivalents.

What is claimed is:

1. A method comprising:
    detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and
    in response to the detection, automatically adjusting operation of the frequency modulated broadcast receiver,
    wherein automatically adjusting operation comprises changing a setting of the frequency modulated broadcast receiver by switching from stereo to mono in such a way as to alter a susceptibility of a speaker arrangement to a possibility of being overdriven by overdeviated frequency modulated broadcasts.

2. A method as claimed in claim 1, comprising detecting that a frequency modulation broadcast receiver is not tuned to an overdeviated frequency modulated broadcast, or is not at a location where overdeviated frequency modulated broadcasts exist; and
    in response to the detection, automatically adjusting one or more parameters or settings in such a way as to increase a susceptibility of a speaker arrangement to a possibility of being overdriven by overdeviated frequency modulated broadcasts.

3. A method as claimed in claim 2, wherein automatically adjusting operation of the frequency modulated broadcast receiver comprises deactivating or switching-out a bandpass filter located in the receiver chain prior to the demodulator.

4. A method as claimed in claim 1, wherein the frequency modulation broadcast receiver is a digital receiver.

5. A method comprising:
    detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and
    in response to the detection, automatically adjusting operation of the frequency modulated broadcast receiver,
    wherein automatically adjusting operation comprises adjusting one or more parameters or settings in such a way as to alter a susceptibility of a speaker arrangement to a possibility of being overdriven by overdeviated frequency modulated broadcasts; and
    wherein automatically adjusting operation of the frequency modulated broadcast receiver comprises changing a setting of the frequency modulated broadcast receiver by performing at least one of the following:
    switching from stereo to mono or
    switching through a menu system or a voice command.

6. A method comprising:
  detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast;
  in response to the detection, automatically adjusting operation of the frequency modulated broadcast receiver,
  wherein automatically adjusting operation comprises adjusting one or more parameters or settings in such a way as to alter a susceptibility of a speaker arrangement to a possibility of being overdriven by overdeviated frequency modulated broadcasts;
  detecting that a frequency modulation broadcast receiver is not tuned to an overdeviated frequency modulated broadcast, or is not at a location where overdeviated frequency modulated broadcasts exist; and
  in response to the detection, automatically adjusting one or more parameters or settings in such a way as to increase a susceptibility of a speaker arrangement to a possibility of being overdriven by overdeviated frequency modulated broadcasts;
  wherein automatically adjusting operation of the frequency modulated broadcast receiver comprises changing a setting of the frequency modulated broadcast receiver from mono to stereo.

7. A method comprising:
  detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and
  in response to the detection, automatically adjusting operation of the frequency modulated broadcast receiver,
  wherein automatically adjusting operation comprises adjusting one or more parameters or settings in such a way as to alter a susceptibility of a speaker arrangement to a possibility of being overdriven by overdeviated frequency modulated broadcasts; and
  wherein detecting whether the frequency modulation broadcast receiver is at a location where overdeviated frequency modulated broadcasts exist comprises comparing a location of the frequency modulation broadcast receiver with a database of locations where overdeviated frequency modulated broadcasts exist or are absent.

8. A method as claimed in claim 7, wherein detecting whether the frequency modulation broadcast receiver is at a location where overdeviated frequency modulated broadcasts exist comprises comparing a location of the frequency modulation broadcast receiver and a tuning frequency of a frequency modulated radio receiver of the frequency modulation broadcast receiver with a database of locations and frequencies at which overdeviated frequency modulated broadcasts exist or are absent.

9. A method comprising:
  detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and
  in response to the detection, automatically adjusting operation of the frequency modulated broadcast receiver,
  wherein automatically adjusting operation comprises adjusting one or more parameters or settings in such a way as to alter a susceptibility of a speaker arrangement to a possibility of being overdriven by overdeviated frequency modulated broadcasts; and
  wherein detecting whether the frequency modulation broadcast receiver is tuned to an overdeviated frequency modulated broadcast comprises comparing a data service-derived station name to a database of known overdeviating radio stations and/or known non-overdeviating radio stations.

10. Apparatus, comprising:
  a frequency modulation broadcast receiver;
  at least one processor;
  at least one memory including computer program code;
  the at least one memory and the computer program code configured to, with the at least one processor, cause the apparatus at least to:
  detect whether or not the frequency modulation broadcast receiver is tuned to an overdeviated frequency modulated broadcast, or is at a location where overdeviated frequency modulated broadcasts exist; and
  in response to the detection, automatically adjusting operation of the frequency modulated broadcast receiver by changing a setting to switch from stereo to mono in such a way as to alter a susceptibility of a speaker arrangement to a possibility of being overdriven by overdeviated frequency modulated broadcasts.

11. Apparatus as claimed in claim 10, wherein the configuration for automatically adjusting operation of the frequency modulated broadcast receiver comprises means for increasing a gain of an audio amplifier, or amplifier adjacent the audio amplifier in a receiver chain, in the receiver.

12. Apparatus as claimed in claim 10, wherein the configuration for automatically adjusting operation of the frequency modulated broadcast receiver comprises means for deactivating or switching-out a bandpass filter located in the receiver chain prior to the demodulator.

13. Apparatus as claimed in any of claims 10, wherein the frequency modulation broadcast receiver is a digital receiver.

14. Apparatus, comprising:
  a frequency modulation broadcast receiver;
  at least one processor;
  at least one memory including computer program code;
  the at least one memory and the computer program code configured to, with the at least one processor, cause the apparatus at least to:
  detect that the frequency modulation broadcast receiver is not tuned to an overdeviated frequency modulated broadcast, or is not at a location where overdeviated frequency modulated broadcasts exist; and
  in response to the detection, automatically adjust one or more parameters or settings in such a way as to increase a susceptibility of a speaker arrangement to a possibility of being overdriven by overdeviated frequency modulated broadcasts;
  wherein the automatically adjusting operation of the frequency modulated broadcast receiver comprises changing a setting of the frequency modulated broadcast receiver by performing at least one of the following:
  switching from stereo to mono or
  switching through a menu system or a voice command.

15. Apparatus, comprising:
  a frequency modulation broadcast receiver;
  at least one processor;
  at least one memory including computer program code;
  the at least one memory and the computer program code configured to, with the at least one processor, cause the apparatus at least to:

detect that the frequency modulation broadcast receiver is not tuned to an overdeviated frequency modulated broadcast, or is not at a location where overdeviated frequency modulated broadcasts exist; and in response to the detection, automatically adjust one or more parameters or settings in such a way as to increase a susceptibility of a speaker arrangement to a possibility of being overdriven by overdeviated frequency modulated broadcasts;

wherein the detecting whether the frequency modulation broadcast receiver is at a location where overdeviated frequency modulated broadcasts exist comprises comparing a location of the frequency modulation broadcast receiver with a database of locations where overdeviated frequency modulated broadcasts exist or are absent.

16. Apparatus as claimed in claim 15, wherein the configuration for detecting whether the frequency modulation broadcast receiver is at a location where overdeviated frequency modulated broadcasts exist comprises configuration for comparing a location of the frequency modulation broadcast receiver and a tuning frequency of a frequency modulated radio receiver of the frequency modulation broadcast receiver with a database of locations and frequencies at which overdeviated frequency modulated broadcasts exist or are absent.

17. Apparatus, comprising:
a frequency modulation broadcast receiver;
at least one processor;
at least one memory including computer program code;
the at least one memory and the computer program code configured to, with the at least one processor, cause the apparatus at least to:
detect that the frequency modulation broadcast receiver is not tuned to an overdeviated frequency modulated broadcast, or is not at a location where overdeviated frequency modulated broadcasts exist; and
in response to the detection, automatically adjust one or more parameters or settings in such a way as to increase a susceptibility of a speaker arrangement to a possibility of being overdriven by overdeviated frequency modulated broadcasts;
wherein the detecting whether the frequency modulation broadcast receiver is tuned to an overdeviated frequency modulated broadcast comprises comparing a data service-derived station name to a database of known overdeviating radio stations and/or known non-overdeviating radio stations.

18. Apparatus, comprising:
at least one processor;
at least one memory including computer program code;
the at least one memory and the computer program code configured to, with the at least one processor, cause the apparatus at least to:
detect whether or not
a frequency modulation broadcast receiver is at a location where overdeviated frequency modulated broadcasts exist, by comparing a location of the frequency modulation broadcast receiver with a database of locations where overdeviated frequency modulated broadcasts exist or are absent; and
to respond to the detection by automatically adjusting operation of the frequency modulated broadcast receiver, wherein automatically adjusting operation comprises adjusting one or more parameters or settings in such a way as to alter a susceptibility of a speaker arrangement to a possibility of being overdriven by overdeviated frequency modulated broadcasts.

19. Apparatus, comprising:
hardware or hardware and software configured to detect whether or not
a frequency modulation broadcast receiver is at a location where overdeviated frequency modulated broadcasts exist, by comparing a location of the frequency modulation broadcast receiver with a database of locations where overdeviated frequency modulated broadcasts exist or are absent; and
hardware or hardware and software configured to respond to the detection by automatically adjusting operation of the frequency modulated broadcast receiver, wherein automatically adjusting operation comprises adjusting one or more parameters or settings in such a way as to alter a susceptibility of a speaker arrangement to a possibility of being overdriven by overdeviated frequency modulated broadcasts.

20. A computer readable non-transitory medium having stored thereon computer code for execution by computer apparatus control, the computer readable medium comprising:
computer code for detecting whether or not a frequency modulation broadcast receiver is tuned to an overdeviated frequency modulated broadcast, or is at a location where overdeviated frequency modulated broadcasts exist or has received a user input indicating the presence of an overdeviated frequency modulated broadcast; and
computer code for responding to the detection, by automatically adjusting operation of the frequency modulated broadcast receiver, wherein automatically adjusting operation comprises changing a setting of the frequency modulated broadcast receiver by switching from stereo to mono in such a way as to alter a susceptibility of a speaker arrangement to a possibility of being overdriven by overdeviated frequency modulated broadcasts.

21. Computer readable instructions that when executed by computer apparatus control it to perform a method as claimed in any of claim 20.

* * * * *